United States Patent [19]

Gilden et al.

[11] 4,085,388
[45] Apr. 18, 1978

[54] MODE-LOCKED, SURFACE ACOUSTIC WAVE OSCILLATOR

[75] Inventors: Meyer Gilden, West Hartford; Thomas M. Reeder, Glastonbury; Anthony J. DeMaria, West Hartford, all of Conn.

[73] Assignee: United Technologies Corporation, Hartford, Conn.

[21] Appl. No.: 725,060

[22] Filed: Sep. 21, 1976

[51] Int. Cl.² ............................................... H03B 5/30
[52] U.S. Cl. .................................. 331/107 A; 328/63; 333/70 R
[58] Field of Search .............................. 333/30 R, 72; 331/107 A; 328/63

[56] References Cited

U.S. PATENT DOCUMENTS

| | | | |
|---|---|---|---|
| 2,617,930 | 11/1952 | Cutler | 328/63 |
| 3,805,189 | 4/1974 | Zucker et al. | 331/107 |

*Primary Examiner*—John Kominski
*Attorney, Agent, or Firm*—Dominic J. Chiantera

[57] ABSTRACT

A mode-locked surface acoustic wave oscillator (MLSO) provides mode-locked, phase coherent RF signal pulses through a regenerative closed loop RF signal path which includes a surface acoustic wave (SAW) delay line having a piezoelectric substrate and a pair of signal transducers relatively disposed at a determined SAW propagation distance along a major surface thereof, an RF amplifier to provide in phase amplification of the RF pulse, and a signal expander circuit for providing an increase in the harmonic frequencies of the RF signal pulse and an increased RF pulse frequency bandwidth. The pulse repetition frequency is determined by the signal propagation time delay, provided primarily by the SAW delay line. The delay line transducers establish the center frequency of the RF signal pulse and the bandwidth of the regenerative loop limits the minimum obtainable RF pulse width. An alternative embodiment of the MLSO includes a secondary loop which provides automatic generation of a synchronized trigger pulse having a pulse repetition frequency (PRF) derived from the RF signal pulse circulating in the regenerative loop. The synchronized trigger modulates the RF signal in the regenerative loop at a PRF equal to the reciprocal of the time delay of the SAW delay line, to further enhance the frequency mode-locked operation.

11 Claims, 9 Drawing Figures

MODE-LOCKED, SURFACE ACOUSTIC WAVE OSCILLATOR

BACKGROUND OF THE INVENTION

1. Field of Invention

This invention relates to radio frequency (RF) signal pulse oscillators, and more particularly to mode-locked, pulsed RF frequency operation of a surface acoustic wave oscillator.

2. Description of the Prior Art

Pulsed RF oscillators for providing phase coherent RF signal pulses are known in the art, and generally provide pulsed RF operation through periodic interruption of a continuous wave RF signal rather than frequency mode-locking within the regenerative RF signal path. An early regenerative type pulse generator for use in the microwave frequency range, which exhibited self mode-locking characteristics was first disclosed by C. C. Cutler in an article "The Regenerative Pulse Generator", Proceedings of the IEEE, February 1955, pages 140–148, and patented under U.S. Pat. No. 2,617,930 issued on Nov. 11, 1952. Laser configurations have been devised which also demonstrated mode-locked oscillation characteristics, as discussed by L. W. Hargrove, R. L. Fork, and M. A. Pollack, in an article "Locking of He-Ne Laser Modes Introduced by Synchronous Intercavity Modulation", Applied Physics Letters, Vol. 5, 1964, pages 4–5 and by A. J. DeMaria, D. A. Stetser and W. H. Glenn, in an article "Ultrashort Light Pulses", Science Magazine, Vol. 156, June 1967, pages 1557–1568, which is the subject of U.S. Pat. No. 3,636,474 entitled "Ultrashort Optical Pulse Generation Utilizing Laser Pumped Lasers", issued on Jan. 18, 1972.

SUMMARY OF THE INVENTION

An object of the present invention is to provide a surface acoustic wave oscillator having mode-locked frequency operation in the radio frequency (RF) range.

According to the present invention, a mode-locked surface acoustic wave oscillator (MLSO) provides mode-locked, phase coherent RF signal pulses through a regenerative RF signal path provided by a positive feedback, closed loop combination of a surface acoustic wave (SAW) delay line having a piezoelectric substrate with a pair of signal transducers relatively disposed at a determined SAW propagation distance along a major surface thereof, an RF amplifier for providing in phase amplification of the RF signal pulses in the loop, and a signal shaping circuit for providing an increased RF signal pulse frequency bandwidth. The pulse repetition frequency (PRF) of the RF signal pulse is determined by the propagation time delay provided predominantly by the SAW delay line. Assuming the amplifier and signal shaping circuit bandwidths are greater than that of the SAW delay line, the delay line transducers establish the center frequency of the RF pulse, while the overall system bandwidth limits the minimum obtainable pulse width, and provides the RF signal pulse with harmonic frequency components which are all high harmonics of the pulse repetition frequency of the SAW delay line.

In further accord with the present invention the signal shaping circuit provides the increased bandwidth by presenting a time varying attenuation characteristic to the RF signal, and the MLSO further comprises a secondary loop which detects the RF signal pulses circulating within the regenerative loop, and provides in response, synchronizing trigger pulses to the signal shaping circuit for modulating the RF signal pulses within the regenerative loop at the PRF of the circulating RF signal, by periodically reducing the attenuation characteristic of the signal shaping circuit at a time coincident with the appearance of an RF signal pulse at the input to the shaping circuit. In still further accord with the present invention, the signal shaping circuit in the regenerative loop is an amplitude modulator, which is modulated, by the synchronizing trigger pulses provided by the secondary loop, at a frequency equal to the reciprocal of the propagation time delay of the regenerative loop, causing generation of upper and lower frequency side bands of the RF signal pulse carrier frequency which are coincident with the regenerative loop resonant frequencies, and which excite the loop resonant frequencies to provide full frequency spectrum excitation of all the mode-locked frequencies within the RF pulse bandwidth, at a defined amplitude and phase relationship. In still further accord with the present invention, the signal shaping circuit is a phase modulator which provides a time varying phase to the RF signal pulses in dependence on the synchronizing pulses from the secondary loops. In still further accord with the present invention, the signal shaping circuit is modulated with an external signal source, which provides synchronizing signal pulses at PRF equal to the reciprocal of the propagation time delay of the regenerative loop.

The mode-locked surface acoustic wave oscillator of the present invention, is a new type of pulsed RF oscillator that inherently has a high degree of phase coherence and oscillation stability. The high degree of phase coherence is the result of the inherent characteristics of the mode-locked oscillation of many individual frequencies having an integer relationship to one another, together with a fixed phase and amplitude relationship. The output RF signal pulses provided by the MLSO may be made extremely narrow, limited only by the overall bandwidth of the system. Alternative embodiments of the MLSO provide for a secondary loop for the automatic generation of synchronizing trigger pulses, having the appropriate PRF, for modulating the RF signal pulses to enhance the mode-locking operation and to ensure self-starting of the oscillator. The MLSO of the present invention provides performance which is equal, or superior, to that provided by the present state of the art pulsed RF signal generators, but at a significant reduction in complexity and cost, since the SAW delay line, which is the major component of the regenerative loop, may be an inexpensive planar device which is readily integrated with an IC, RF amplifier. The MLSO of the present invention provides an accurate set of RF frequencies all having an integral relationship, in addition to a fixed phase and amplitude relationship. The coherent destructive and constructive interference of these frequencies result in a pulsed output having a PRF equal to the frequency difference between adjacent frequencies in the RF signal pulse frequency spectrum. The MLSO may be used as a source of high accuracy timing signals, or in frequency synthesizer applications.

Other objects, features and advantages of the present invention will become more apparent in the light of the following detailed description of the preferred embodiments thereof, as illustrated in the accompanying drawing.

DESCRIPTION OF THE PREFERRED EMBODIMENT

The mode-locked SAW oscillator (MLSO) of the present invention provides regenerative pulse operation in the RF frequency range, and utilizes in part the basic characteristics of the delay line controlled, continuous wave SAW oscillator described by M. F. Lewis, in an article entitled "Some Aspects of SAW Oscillators", Ultrasonics Symposium Proceedings, 1973, pages 344-347. The MLSO is provided in a first embodiment as a passive device comprising a single regenerative signal path, and in alternative embodiments as an active MLSO having a regenerative signal path and a secondary modulation signal path which provides synchronization of the RF signal pulse with a modulation signal derived from the RF signal pulse itself.

Figure 1:
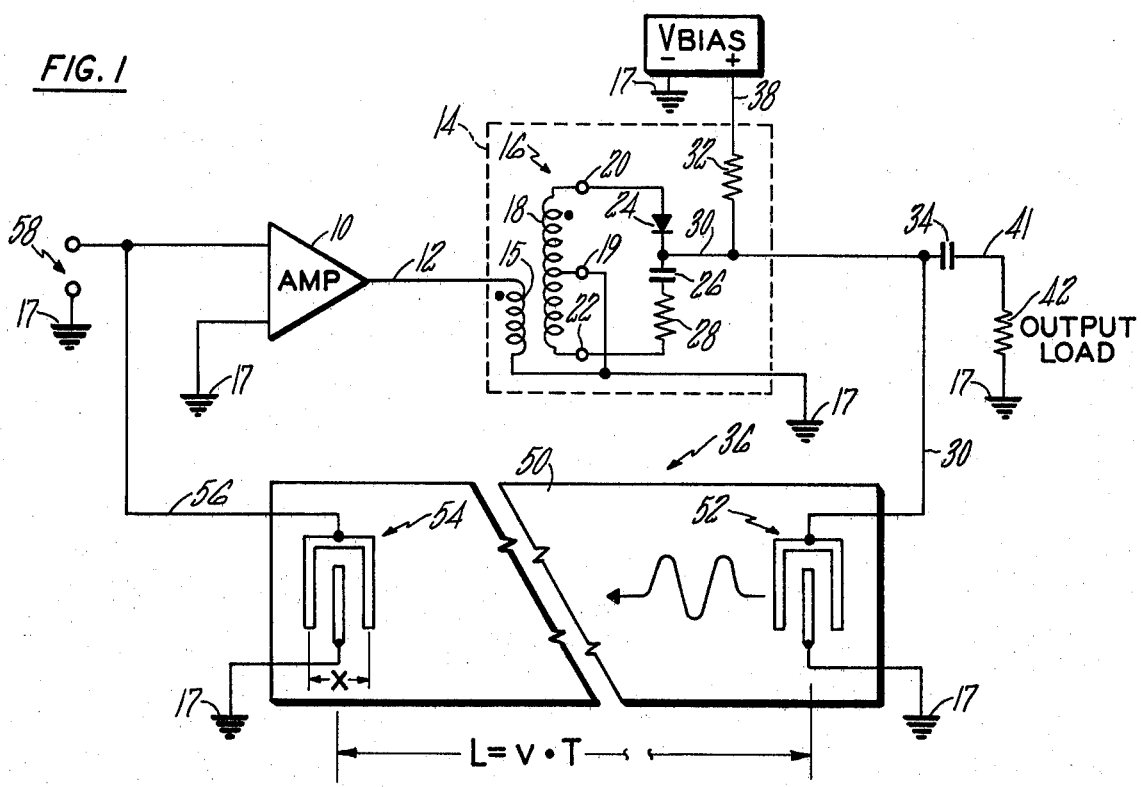
FIG. 1 is a schematic diagram of an illustrative embodiment of a mode-locked surface acoustic wave oscillator according to the present invention.
Figure 2:
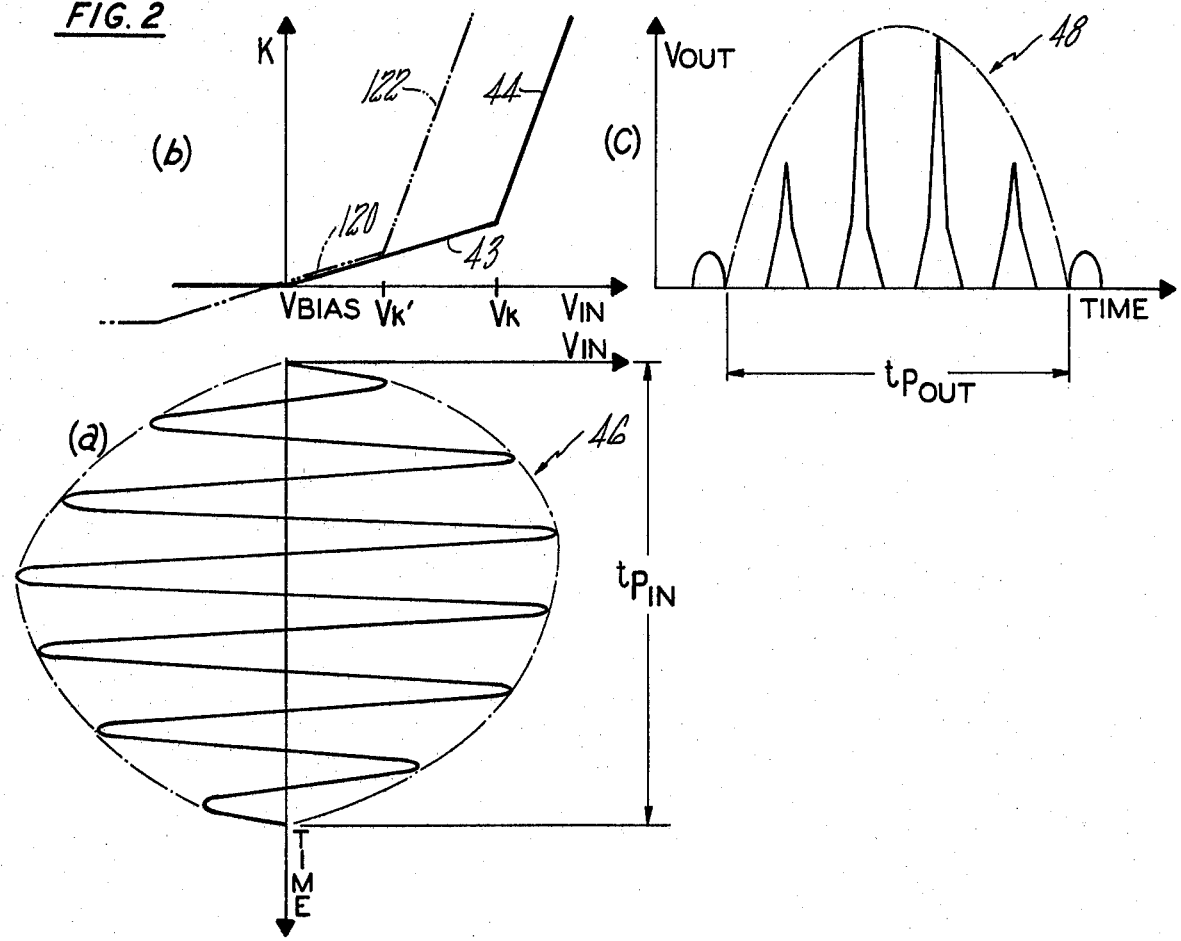
FIG. 2 is an illustration of the nonlinear transfer characteristic of a signal expander circuit used in the embodiment of FIG. 1.

Referring now to FIG. 1, in the passive embodiment of the MLSO of the present invention, a regenerative loop is comprised of an RF amplifier 10, of a type well known in the art such as the Avantek model UTO-521 broadband RF amplifier. The output RF signal of the amplifier 10 is connected through a line 12 to the input of a signal shaping circuit, such as an expander circuit 14, which provides nonlinear attenuation of the input RF signal in dependence on its amplitude. In general the nonlinear attenuation characteristic of the expander provides less severe attenuation of a large amplitude signal than a low amplitude signal, as described in detail hereinafter, and may be implemented in a number of different embodiments. In the embodiment of FIG. 1, the expander 14 receives the signal at one terminal of a primary winding 15, of a transformer 16, the other side of which is connected to a system ground plane 17. The signal is magnetically coupled to the transformer secondary winding 18, which is connected at a center tap 19 to the ground plane 17, and which is connected through end terminals 20, 22 across an electrical network including the series combination of a diode 24, capacitor 26, and a resistor 28. The diode 24 is a semiconductor mixer or detector diode of a type well known in the art, such as a Hewlett Packard HP2811 having a low junction capacitance and low recombination time suitable for use in the RF frequency range, and is connected at the anode to the terminal 20 and at the cathode to the capacitor 26. The capacitor 26 and resistor 28 are of a type well known in the art. The junction of the diode 24 and capacitor 26 is connected through a line 30 to one side of a resistor 32, a capacitor 34, and to the input of a surface acoustic wave (SAW) delay line 36. The secondary winding 18 in parallel combination with the diode 24, capacitor 26, and resistor 28 form a balanced bridge network in the absence of an input RF signal, with the output of the bridge being measured between the line 30 and the center tap terminal 19. The other side of the resistor 32 is connected through a line 38 to one side of a DC voltage source 40, the other side of which is connected to the ground 17. The other side of the capacitor 34 is connected through a line 41 to one side of a resistor 42 which represents the "lumped" resistive load at the output of the MLSO. The other side of the resistor 41 is connected to the ground plane 17. In the operation of the expander 14, a sinusoidal AC signal on the line 12 is coupled to the transformer secondary winding 18 through a determined turns ratio. The voltage signals across the secondary winding terminals 20 to 19 and 19 to 22 are in phase with each other. The diode 24 provides positive rectification of the signal across the secondary winding 18, and the forward conduction of the diode with respect to the amplitude of the secondary winding signal is determined by a threshold value in dependence on the magnitude of a DC bias voltage signal presented to the cathode of the diode 24 from the source 40. The capacitor 26 provides impedance balancing of the bridge configuration in combination with the resistor 28, and also provides DC signal blocking to allow the diode 24 to be properly biased. The DC bias signal magnitude determines the degree of forward conduction of the diode as a function of the amplitude, of the signal on the line 12. As the diode conduction increases with increasing RF signal amplitude in dependence on the diode nonlinear exponential characteristic, the dynamic impedance of the diode decreases in a reciprocal manner. The change in dynamic impedance unbalances the bridge and provides the expander nonlinear insertion loss characteristic which has a magnitude inversely proportional to the exponentially varying forward conduction characteristic of the diode. The transfer characteristic of the diode 24 is shown in FIG. 2, illustration (b), as a "straight line" approximation of the exponential characteristic, and includes two discrete gain regions represented by the lines 43, 44. The gain region 43 represents the low conductance portion of the diode forward characteristic which extends to a threshold value $V_k$ established in dependence on the bias voltage signal from the source 40. Conversely, the gain region 44 represents the high conductance portion of the diode which provides the low insertion loss region of the expander. In operation, an RF signal pulse having an envelope 46 (FIG. 2, illustration (a)) has a number of RF carrier frequency cycles of varying amplitude. The lower amplitude cycles (below the threshold $V_k$) are severely attenuated, while the larger amplitude pulses are shaped by the nonlinear, decreasing insertion loss characteristic to provide a sharpening of the positive portion of the higher amplitude RF cycles. As a result, the larger amplitude RF cycles are coupled through the expander with less attenuation than the low amplitude cycles. The output RF signal pulse from the expander is shown in illustration (c), and has a narrowed pulse envelope 48 and a pulse width $t_{P_{out}}$ which is less than that of the input RF pulse $t_p$ in. As a result, the positive portion of the sinusoidal signal on the line 12 is sharpened during conduction through the expander 14, causing an increase in the signal pulse harmonic frequencies, and consequently an increase in the signal pulse bandwidth. The negative portion of the line 12 signal is blocked by the diode 24, such that the signals appearing on the line 30 represent a series of positive half-wave sinusoidal pulses.

The narrowed pulse width signal from the expander is presented to the input of the SAW delay line 36, which is of a type well known in the art and includes a piezoelectric material substrate 50, such as lithium niobate (which provides a combination of strong piezoelectric coupling with low acoustic propagation loss and large time delay per unit length). The substrate is formed in the shape of a flat bar and disposed on the surface of a suitable supporting base. Two interdigital (ID) acoustic transducers 52, 54 are relatively disposed at a determined distance L on opposite ends of the exposed surface of the substrate 50 through a suitable photolithographic process similar to that used for providing metallization in integrated circuit manufacturing. The transducers 52, 54 are shown in an ID configuration having only one pair of opposite phase electrodes each, however, they may be configured in a number of other array configurations known in the art including a multi-electrode configuration. The limitation on the size and number of electrode pairs is determined respectively by the operating frequency, and desired bandwidth of the MLSO. The SAW delay line 36 provides the operating frequency bandwidth for the loop, by functioning as a band-pass filter whose upper and lower frequency limits are established by geometry of the transducers 52, 54. For the interdigital transducer geometry shown, the bandwidth is established by the number of fingers in the pair of transducer electrodes. The higher the number of fingers in each electrode, the smaller the bandwidth of the SAW delay line and the total loop. The center electrodes of the transducers 52, 54 are connected to the ground plane 17. The opposite phase electrode of the transducer 52 is connected to the line 30, and the opposite phase electrode of the transducer 54 is connected through a line 56 to the noninverting input of the amplifier 10 to complete the regenerative loop of the MLSO. An input pair of terminals 58 is provided to permit injection of an initial energy pulse into the MLSO loop to initiate the oscillatory mode as described in detail hereinafter.

The operation of SAW delay lines is well known, and reported in the art (N. G. Holland and L. P. Claiborne, "Practical Surface Acoustic Wave Devices", Proceedings of the IEEE, Vol. 62, pages 582–611, May 1974). The electrical signal presented through the line 30 to the opposite phase electrode of the transducer 52, excites a periodic electric field which penetrates into the piezoelectric substrate 50. The substrate 50 responds by periodically expanding and contracting in phase with the electric field creating a SAW which propagates along the surface of the substrate in two directions normal to the transducer ID electrodes. The only SAW of interest is that which propagates along the distance L from transducer 52 to transducer 54, such that acoustic absorbing material may be added to the substrate to absorb the opposite direction waves. The strongest SAW from the ID transducer occurs near the resonant frequency of the transducer ($f_o$), which is the center frequency of the frequency passband created by the transducers, and which is defined by the saw velocity ($v$) and the periodic length ($x$) of the transducer ID pattern as: $f_o = v/x$. The periodic length is the on center spacing for each opposite electrode pair, and for the transducers 52, 54 is equal to one wavelength ($\lambda$) of the the center frequency $f_o$. This results in an electrode width and spacing for the transducers 52, 54 equal to $\lambda/4$.

The length (L) of the substrate 50 is measured between the centers of the transducers 52, 54 and is equal to an integral number of wavelengths of the center frequency $f_o$. Since SAW velocities ($v$) are approximately equal to 3,000 meters per second, which is five orders of magnitude smaller than the velocity of light $c$, the wavelength of the SAW is similarly five orders of magnitude smaller than that of an electromagnetic wave of the same frequency ($f_o = c/\lambda$). The SAW wavelength of a 100 megahertz signal is equal to approximately 30 micrometers. The propagation time (T) required for a SAW to propagate between the transducers along the distance L is: $T = L/v$. Typical SAW delay line values extend from 0.1 to 10 microseconds, depending upon the operating frequency and number of wavelengths selected. The length L for the 100 megahertz signal corresponding to the limits of this time delay range, varies from 0.30 to 30 millimeters.

The operation of the MLSO is best understood by first describing the operation of a continuous wave (CW) single frequency SAW oscillator, which basically includes a SAW delay line in combination with a feedback amplifier. The MLSO embodiment of FIG. 1 with the expander circuit 14 removed and the line 12 connected directly to the line 30, is fundamentally representative of a CW SAW oscillator. In the operation of such a CW oscillator, a short burst of energy within the passband of the SAW transducers is introduced into the loop. The insertion loss of the SAW delay line is typically in the order of −20 to −30 db, and the gain of the feedback amplifier is established at a value high enough to compensate for this insertion loss to provide an overall loop gain (the product of the amplifier gain and the SAW delay line insertion loss) which exceeds unity, i.e. the loop gain exceeds the circuit losses. Under these conditions, the pulse introduced into the loop is amplified as it circulates around the loop. The SAW delay line provides a propagation time delay to the pulse, which is much, much greater than the propagation delay provided by the amplifier. This SAW time delay in combination with the cumulative dispersive effects of the loop, causes the pulse to become less and less defined as it circulates around the loop. Finally, a state of stable, single frequency CW operation is reached with the amplifier in a state of saturation and the net loop gain equal to unity. A significant characteristic of the CW SAW oscillator is that as a result of the long time delay provided by the SAW delay line, there are a plurality of frequencies which satisfy the condition for CW oscillation. These potential oscillation frequencies form a comb frequency spectrum within the bandwidth established by the SAW transducers wherein each potential oscillation frequency has a time period which is an exact submultiple of the total delay time around the feedback loop. Since the time delay provided by the amplifier is negligible in comparison to the delay of the SAW delay line, the time periods are, to first order approximation, submultiples of the SAW propagation time delay (T), and all of the potential oscillation frequencies are harmonics of the SAW pulse repetition frequency (PRF) $f_a$, where $f_a = 1/T$. Therefore, the frequency spacing between successive oscillation frequencies in the comb frequency spectrum is equal to $f_a$. In general, only the oscillation frequency for which the initial loop gain is maximum will be excited, however, under certain conditions frequency mode jumping to nearby frequencies can occur which results in unstable multifrequency operation for such devices. The introduction of an element into the SAW oscillator loop which continues to sharpen the initial pulse as it circulates around the loop causes the pulse mode of operation to persist to the exclusion of the CW operation. The use of the expander circuit 14 in the MLSO loop provides this pulse sharpening.

Figure 3:
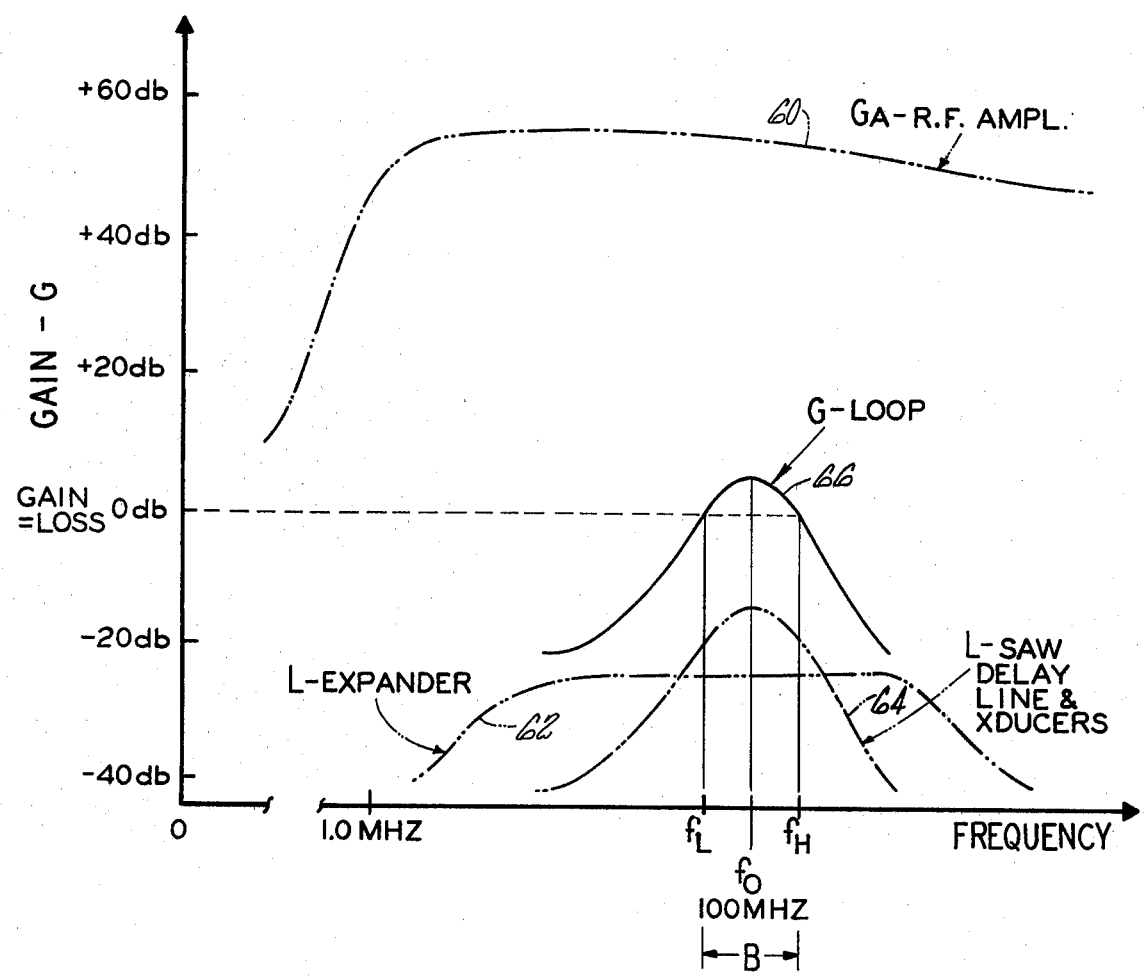
FIG. 3 is an illustration of the gain characteristics versus frequency of the MLSO embodiment of FIG. 1.

In the MLSO of FIG. 1, the SAW delay line 36 and the expander 14 have equally high insertion losses which are dependent on the operating resonant frequency, and the gain of the amplifier 10 is sufficiently high to ensure a minimum steady state loop gain equal to, or greater than unity at this frequency. As shown in FIG. 3, which is a plot of gain versus frequency, typical insertion loss values for the SAW delay line 36 and the expander 14 at a frequency of 100 megahertz are each on the order of −20 to −30 db, such that the range of gain of the amplifier 10 must be on the order of +40 to +60 db (a voltage gain of 100 to 1,000 volts per volt, or a power gain of 100,000 to one million watts per watt). The gain of the amplifier 10, and the attenuation, or loss L, of the expander 14 and the SAW delay line 36, are shown by the phantom curves 60, 62 and 64 respectively. The sum of the three curves provides a resultant gain curve 66, which defines the overall loop gain as a function of frequency. The loop gain curve 66 has a peak value at a frequency $f_o$, which is the center frequency of the passband provided by the SAW delay line (curve 64). The minus three db points of the curve 66 define the low and high frequency limits $f_L$, $f_H$, and the bandwidth of the loop (B) is defined as: $B = f_H - f_L$. As the gain of the amplifier is increased, more of the curve 66 is increased above the zero db point (the point where the gain = loss). This results in an increase in the overall loop bandwidth, as shown by the curve 68 of FIG. 4, where the increased bandwidth is B'. As shown, a greater number of frequencies within the comb spectrum 68 falls within the overall loop gain passband 70, such that the total number of potential MLSO oscillating frequencies increase. The bandwidth for the curve 70 is $B' = f_H' - f_L'$, and the minimum pulse width for the MLSO is $t_p = 1/B'$. The potential number of oscillation frequencies may be quite high, for example a SAW time delay of 2 microseconds ($T = 2$ microseconds) provides a SAW frequency $f_a$ equal to 500 kilohertz. For a center frequency $f_o = 100$ MHz, and a bandwidth $B' = 20$ megahertz, there are 40 potential oscillating frequencies ranging from $f_L' = 90$ MHz, and increasing in increments of 500 kilohertz to a high frequency $f_H' = 110$ MHz. Since B' is determined by the overall gain of the system, B' can be made smaller, or greater than B of FIG. 3.

In the operation of the MLSO of FIG. 1, an initial transient pulse is introduced into the loop at input terminals 58. The amplifier 10 amplifies the pulse to ensure a peak amplitude greater than the magnitude $V_k$ of the expander characteristic (FIG. 2, illustration (b)) to permit conduction of the pulse through the expander circuit high insertion loss region which would otherwise attenuate the pulse, and inhibit the oscillation mode start-up. The expander transfer characteristic attenuates all spurious noise pulses having amplitudes less than $V_k$, and provides pulse sharpening of the RF carrier frequency cycles and a resultant narrowed pulse width of the RF pulse envelope, as described hereinbefore. The narrowed pulse circulates through the SAW delay line 36, which restores the rectified pulse to an AC signal, after a delay T and is re-amplified through the amplifier 10 to restore the pulse amplitude attenuated by the expander 14 and SAW delay line 36. The increase in the pulse width during successive circulation of the pulse around the loop due to the dispersive characteristics of the loop is more than compensated for by the repeated narrowing of the pulse by the expander 14 on each circulation. This narrowing of the pulse width continues until limited by the bandwidth B' of the regenerative loop. As a result of this repeated narrowing of the pulse by the expander, the pulsed mode of operation is made to persist to the exclusion of the continuous wave oscillation mode.

Figure 4:
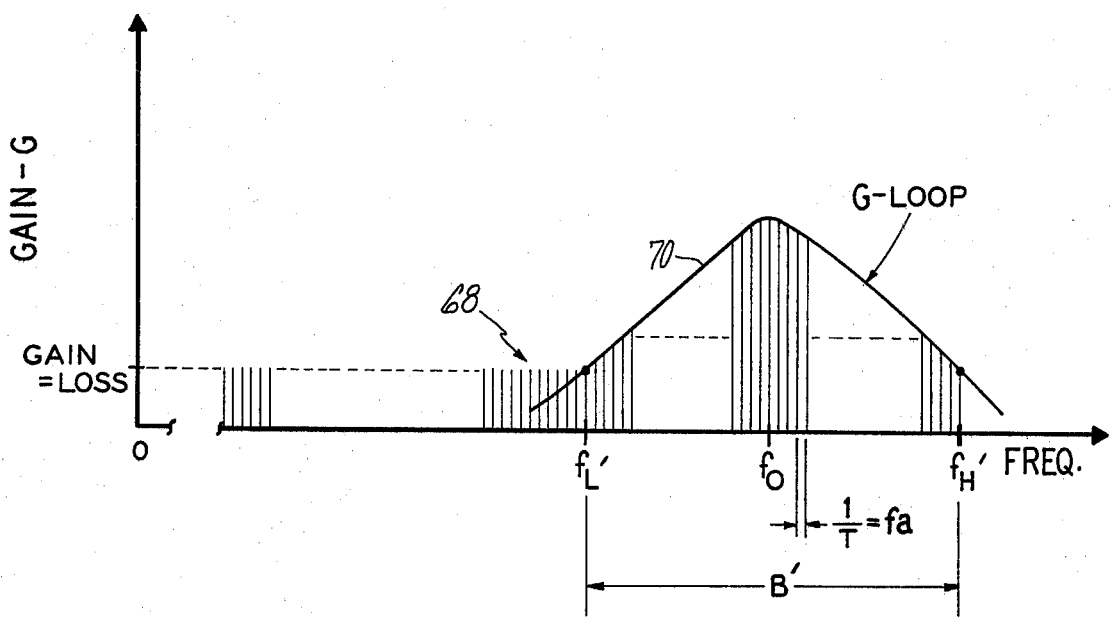
FIG. 4 is an alternative illustration of the gain bandwidth characteristics of the MLSO embodiment of FIG. 1.
Figure 5:
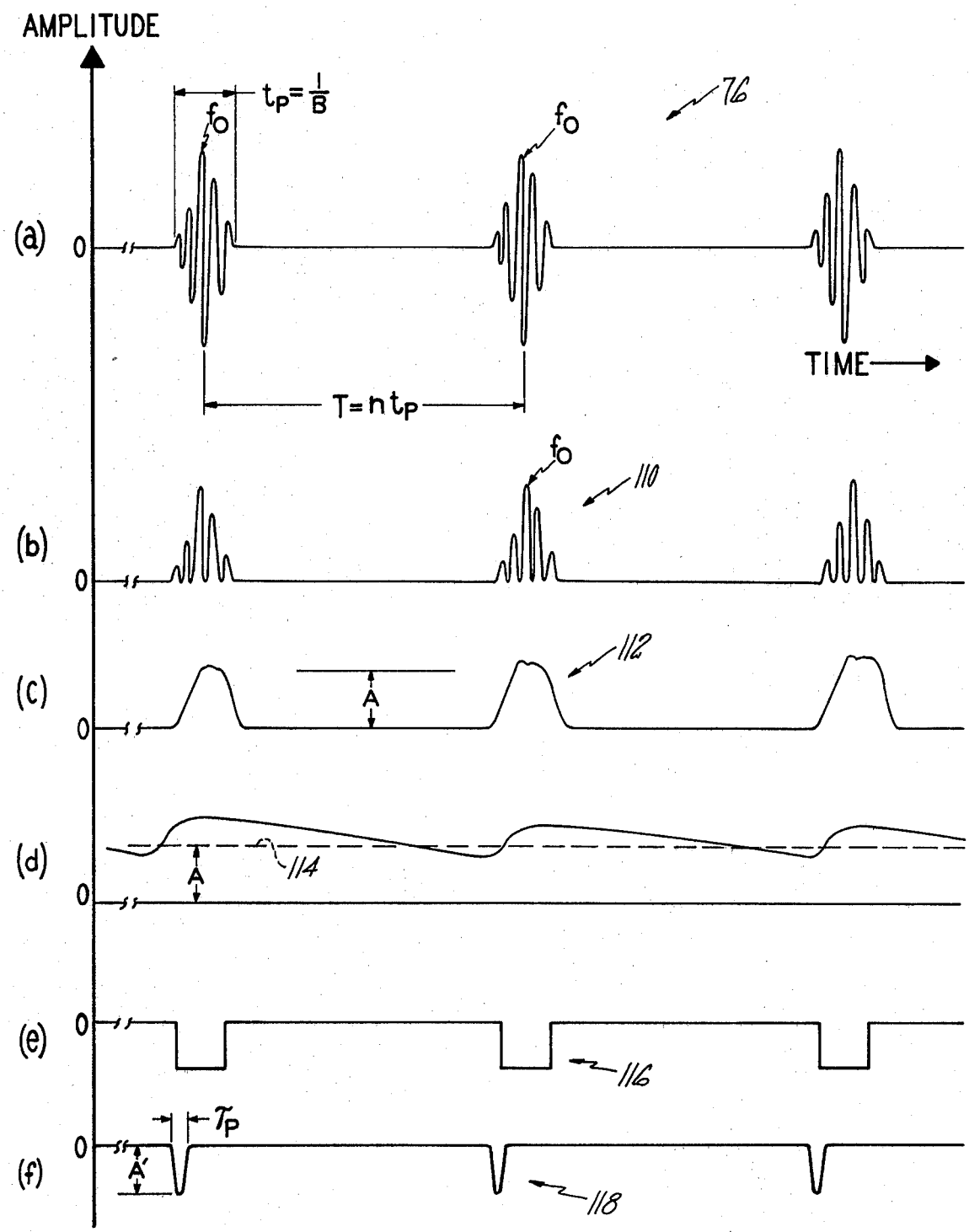
FIG. 5 is a time domain illustration of the operating signals used in the description of the embodiment of FIG. 1.

The frequency spectrum of the repetitive output pulse train from the MLSO comprises a comb frequency spectrum (68 of FIG. 4) which is predicted by Fourier analysis. The repetitive pulse output results from the constructive and destructive interference of these individual harmonic frequencies, which are integerly related frequencies having a fixed phase and amplitude relationship between each other. Consequently there is a high degree of phase coherence in the RF wave form of each pulse, i.e. the RF signal pulse carrier frequency ($f_o$) is said to have phase coherence from pulse to pulse. This is shown by the series of RF pulses 76 in FIG. 5, illustration (a), where the pulse repetition period of the pulses equal the SAW delay time T, and each of the pulses comprise an integral number of cycles of the RF carrier frequency $f_o$. This results from the pulse width $t_p$ being equal to the reciprocal of the bandwidth, which itself includes an integral number of harmonics of the frequency $f_a$, such that the pulse repetition period is also equal to an integral number of pulse width values. This provides the MLSO with the high degree of phase coherence, with the RF component in each pulse envelope beginning at a coherent, repeatable point. In addition, the relatively long time delay obtainable with the SAW delay line, results in high Q values for the passive portion of the circuit. This enhancement of the total circuit Q allows the MLSO to achieve highly stable, low noise oscillations.

The operation of the MLSO of FIG. 1 as a regenerative pulse generator is dependent on the pulse sharpening provided by the expander circuit attenuation of the side portions of the envelope of the RF signal pulses appearing on the line 12. As described hereinbefore, the expander nonlinear attenuation characteristic provides a high insertion loss value for the portion of the sinusoid signal amplitude below a threshold value $V_k$ established by the magnitude of the voltage bias signal, and provides a low insertion loss region for the higher amplitude portion of the sinusoid above the threshold value. The threshold level value determines the degree of pulse sharpening provided by the expander, i.e. the higher the value of $V_k$, the narrower the output pulse (within the limitation of the loop bandwidth). As such the expander 14 is an amplitude sensitive device. If, due to cumulative dispersive effects around the loop, i.e. such as long term changes in the amplifier gain due to changes in ambient temperature, the pulse amplitude becomes attenuated over a period of time to a peak amplitude below the expander threshold $V_k$, it is possible for the oscillatory mode to be destroyed. It is desirable, therefore, to ensure that the expander will not destroy the oscillatory mode but will still attenuate all of the spurious noise pulses which may be introduced into the loop. This may be accomplished by providing a synchronized trigger pulse to the expander of FIG. 1 which is derived from the RF signal pulse itself, and which momentarily reduces the threshold value at a time coincident with the appearance of a circulating signal pulse to ensure an output response, while still providing the expander nonlinear transfer characteristic to the circulating pulse for pulse sharpening. A method for providing such a synchronized, trigger pulse to the expander is through a "bootstrap" function provided by a secondary loop. Alternatively, the expander may be replaced by a modulator which provides either amplitude or frequency modulation of the RF signal pulses at a modulating frequency substantially equal to the pulse repetition frequency of the SAW delay line. The amplitude modulator provides, in effect, a time varying attenuation, or loss, characteristic, and the frequency modulator provides a time varying phase characteristic. The modulation frequency is similarly derived from the RF signal pulse in a secondary loop. Each of these alternative embodiments are described in detail hereinafter.

Figure 6:
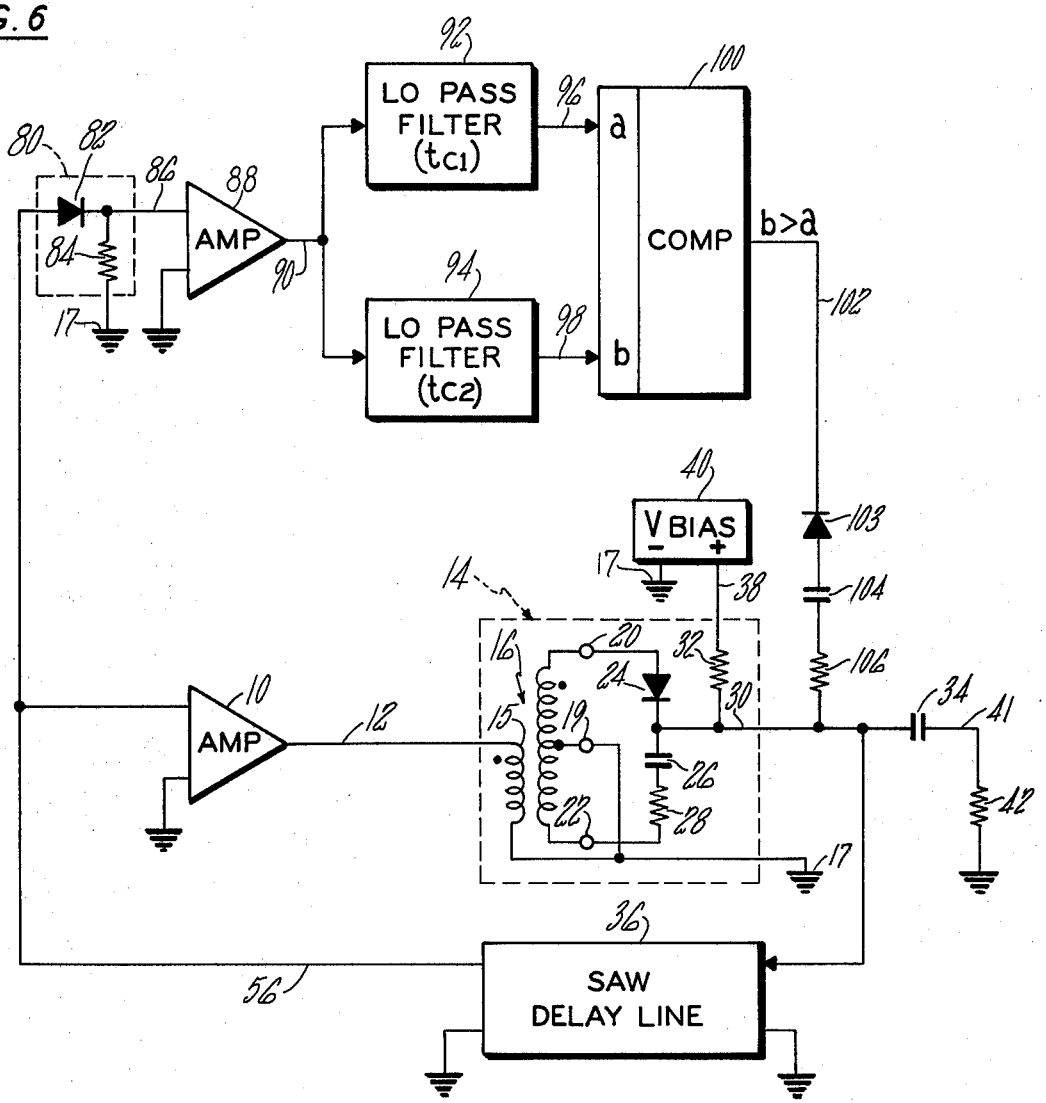
FIG. 6 is a schematic diagram of an alternative embodiment of the MLSO according to the present invention.

Referring now to FIG. 6, in an exemplary embodiment of an active MLSO having a primary loop, or regenerative RF signal path, comprising the RF amplifier 10, expander circuit 14 and SAW delay line 36 identical to those of FIG. 1, the line 56 which presents the output signal on the SAW delay line 36 to the RF amplifier 10 is also connected to the input of an RF detector 80, the first element in the secondary loop. The RF detector 80 is shown schematically as comprising a diode 82, of a type well known in the art such as the 1N14 and a resistor 84. The anode of the diode is connected to the line 56, and the cathode is connected through a line 86 to one side of the resistor 84, the other side of which is connected to the ground plane 17, and to the noninverting input of an operational amplifier 88 of the type well known in the art, such as the National Semiconductor LM101. The amplifier 88 is not a broadband RF amplifier since, as described hereinafter, the secondary loop provides filtering of the regenerative pulse to remove the RF carrier frequency. The output signal from the amplifier 88 is presented through a line 90 to the input of each of a pair of low-pass filters 92, 94, which may be either active or passive type filters of a type known in the art. The filters have different time constants. The time constant of the filter 92 ($t_{c1}$) is equal to several periods of the RF pulse carrier frequency, and the time constant of the filter 94 ($t_{c2}$) is equal to several pulse repetition periods, or time delay values (T), of the SAW delay line 36. The filter 92 filters the pulse on the line 90 to remove the RF carrier component, while the filter 94 responds to the series of pulses on the line 90 to provide a continually updated average value of the pulse signal amplitudes. The output of the filters 92, 94 are presented through the lines 96, 98 to different inputs of a comparator 100, also of the type well known in the art, which provides a positive voltage level signal on an output line 102 in response to a magnitude of the average pulse amplitude on the line 98 which exceeds the magnitude of the signal on the line 96. Nominally this condition exists only during the pulse repetition period, i.e. in the absence of a pulse signal on the line 96. The appearance of a pulse on the line 96 having an amplitude in excess of the average pulse amplitude value on the line 98, causes the comparator 100 to change states, and the signal on the line 102 to transition to a negative voltage level signal for a time period in dependence on the pulse width and at a pulse repetition frequency (PRF) equal to $f_a$, the PRF of the SAW delay line 36. The signal on the line 102 is presented to a series electrical network comprising a diode 103, a capacitor 104 and a resistor 106. The cathode of the diode 103 is connected to the line 102, and the anode is connected to the capacitor 104. The diode functions as a "steering" diode to provide signal coupling of only the negative voltage signals on the line 102. The other side of the capacitor 104 is connected to the resistor 106, the other side of which is connected to the output of the expander 14 on the line 30.

In the operation of the active MLSO of FIG. 6, the RF signal pulses produced by the primary loop (pulses 76 of FIG. 5, illustration (a)) are presented through the line 56 to the RF detector 80. The detector rectifies the RF signal pulse carrier frequency through the diode 82 and provides the rectified pulses 110 (FIG. 5, illustration (b)) on the line 84. The pulses on the line 84 are amplified by amplifier 88 and presented to the filters 92, 94. The low-pass filter 92 filters out of the RF carrier frequency and provides a "video pulse" (the pulse envelope), as shown by pulse 112 in FIG. 5, illustration (c), on the line 96. The long time constant ($t_{c2}$) of the low-pass filter 94 provides an "averaging" of the instantaneous amplitudes of the individual pulses presented on the line 90, as shown in FIG. 5, illustration (d) by the average pulse amplitude 114. The average pulse amplitude signal and the "video pulses" on the line 96, are compared by the comparator 100 which provides a negative output voltage signal each time the instantaneous amplitude of the video pulses on the line 96 exceeds the average pulse amplitude value on the line 98 (as shown by the signals 116 in FIG. 5, illustration (e)). The negative voltage signals on the line 102 are coupled through the diode 103 to the capacitor 104 and resistor 106 which in combination function as a differentiating network with a time constant approximately equal to $C_{104} \cdot R_{106}$. The differentiating network responds to the negative signals by differentiating the leading edge to provide a negative pulse wave form, as shown by the pulse signals 118 of FIG. 5, illustration (f). The pulse signals 118 have a determined amplitude (A') and time duration ($\tau_p$) which are controlled by selection of the $C_{104}$ and $R_{106}$ values. The pulses 118 are presented to the cathode of the diode 24 of the expander 14, causing a momentary decrease in the bias signal magnitude and the threshold value $V_k$ (FIG. 2, illustration (b)). The results in a transient reduction of the threshold value $V_k'$, and as shown by the phantom lines 120, 122 of FIG. 2, illustration (b), momentarily shifts the expander transfer characteristics to a lower value. The high frequency components of the transient spike signal add with the harmonic components of the RF signal pulse to further enhance the mode-locked frequency operation of the loop. The appearance of the pulse 118 on the line 30 is synchronized with the appearance of the pulse envelope on the line 12 such that the two are coincident. This ensures a reduction in expander attenuation only for the desired pulse signal. The reduced expander attenuation similarly ensures continued operation of the MLSO oscillation mode despite pulse amplitude attenuation to values below the expander threshold voltage $V_k$ due to changes in loop gain as a result of temperature changes.

As contrasted with the MLSO embodiment of FIG. 1, the embodiment of FIG. 6 is self-starting. The extreme high loop gain during the transient reduction in the expander insertion loss causes the initialization of the oscillatory mode which is reinforced on successive pulse circulation around the loop, without the introduction of an initial pulse into the loop from an outside source. Since the low-pass filter 94 provides the average pulse amplitude of some number of preceding pulses, the average pulse amplitude value is constantly updated to follow long term changes in the loop operation. This eliminates the potential destruction of the oscillation mode due to comparison of the instantaneous pulse amplitude to a fixed threshold value.

The pulse signal output of the MLSO of FIG. 6 exhibits the same phase coherence as that of the FIG. 1 embodiment, and in addition allows a sharper pulse to be achieved in the expander circuit 14, by allowing a higher steady state threshold voltage value $V_k$, i.e. the higher the value of $V_k$, the sharper the output pulse on the line 30, without the destruction of the oscillation mode due to the inability of a low amplitude pulse to be coupled through the expander. The MLSO of FIG. 6 is particularly suitable for use in variable ambient temperature environments, and as with the embodiment of FIG. 1 is suitable for use in timing circuits to provide accurate pulse timing characteristics for any system requiring such.

As stated hereinbefore, the relationship of the harmonic frequency components of the RF signal pulse to the PRF of the SAW delay line, is a characteristic provided by the delay line. The expander of the MLSO embodiments of FIGS. 1, 6 provide the pulse width narrowing, by nonlinear signal shaping, which provides additional harmonic frequency components whose number is limited by the loop bandwidth B' (FIG. 4). An alternative method of providing the pulse width compression is illustrated in an alternative embodiment of an active MLSO in FIG. 7, with an amplitude modulator inserted into the RF regenerative loop in place of the expander. The modulator provides amplitude modulation of the RF carrier frequency in the regenerative loop at a frequency equal to the PRF of the SAW delay line $(f_a)$.

Figure 7:
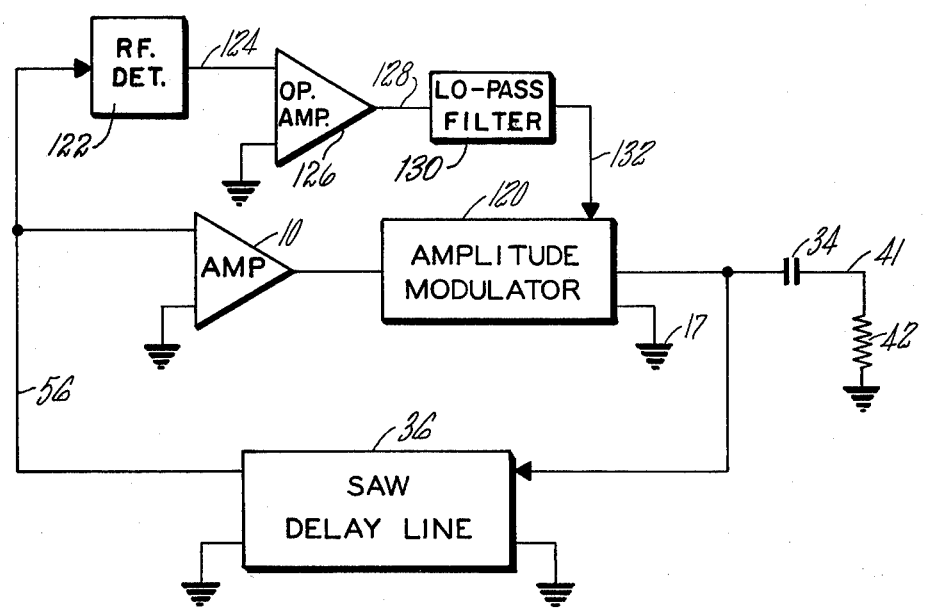
FIG. 7 is a schematic diagram of a third embodiment of the MLSO according to the present invention.

Referring now to FIG. 7, in an alternative embodiment of an active MLSO according to the present invention, the primary RF loop is identical to that of the MLSO embodiments of FIGS. 1, 6 except that the expander circuit 14 is replaced with an amplitude modulator 120. A secondary loop includes an RF detector 122, identical to the RF detector 80 of FIG. 6, which receives the RF signal pulses on the line 56 and provides rectification of the RF carrier frequency. The rectified carrier signal is presented through a line 124 to an operational amplifier 126, identical to the amplifier 88 of FIG. 6. The amplified signal at the output of the amplifier 126 is presented through a line 128 to a low-pass filter 130 which has a time constant equal to several periods of the RF carrier frequency, and which filters out the RF carrier frequency to provide only the envelope of the RF pulse, or "video pulse", on a line 132. The RF signal pulse envelope on the line 132 is presented to a gate input of the amplitude modulator 120. Since the RF signal pulses on the line 56 appear at a PRF equal to $f_a$, the PRF of the pulse signal envelope on the line 132 is equal to $f_a$.

Figure 8:
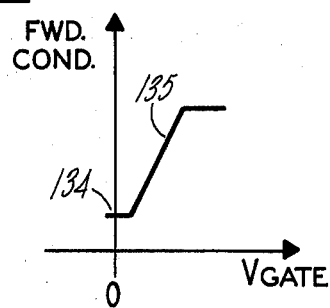
FIG. 8 is an illustration of the signal transfer characteristics of an amplitude modulator used in the embodiment of FIG. 7.

The amplitude modulator 120 may be any one of a number of modulators known in the art which provide variable attenuation characteristics in dependence on an applied gate signal. In its simplest form the amplitude modulator may comprise a gated switch having essentially two operative states, a high attenuation state and a high conductance state. The modulator provides the high conductance state in the presence of a pulse signal envelope appearing on the line 132. A typical transfer characteristic of the modulator 120 is shown in FIG. 8, which is an illustration of the forward conduction versus gate signal magnitudes. The modulator nominally has some degree of forward conduction even in the absence of a pulse signal at the gate input to allow RF signal conduction through the RF loop during initial start-up. The modulator provides increased signal conduction through a determined transfer characteristic 135 in response to the magnitude of the pulse signal envelope on the line 132.

Figure 9:
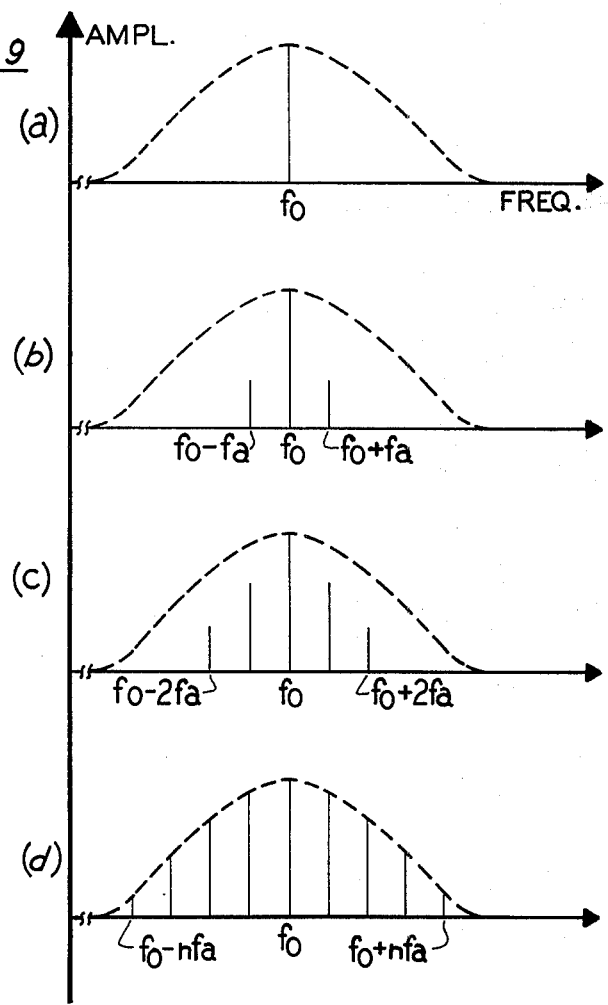
FIG. 9 is a frequency domain illustration used in the description of the embodiment of FIG. 7.

In the operation of the MLSO of FIG. 7, the initial forward conductance of the modulator 120 allows the regenerative RF loop to self-start during power turn on. As described hereinbefore, the center frequencies nearest the peak gain of the MLSO frequency bandwidth are the first to oscillate. After circulation of this initial RF signal pulse through the delay line 36 to the amplifier 10 and RF detector 122, the secondary loop provides a corresponding pulse signal envelope on a line 132 to the gate input of the modulator 120. The modulator is pulsed on for the time duration of the line 132 pulse envelope. At successive circulations of the RF pulse around the regenerative loop, the modulator 120 is continually gated on at the PRF of the SAW delay line $(f_a)$. Since the immediately adjacent harmonic component frequencies to $f_o$ in the mode-locked comb frequency spectrum are separated from $f_o$ by a value equal to $f_a$, the side bands of the oscillating $f_o$ signal pulse at $f_o \pm f_a$ are further excited. To a first order of approximation, the coincidence of the upper $(f_o + f_a)$ and lower $(f_o - f_a)$ side bands with the corresponding resonant frequencies of the mode-locked comb frequency spectrum, causes these frequencies to increase with a defined amplitude and phase relationship. In turn, the $f_o + f_a$ and $f_a - f_a$ oscillations pass through the amplitude modulator, and their side band frequencies excite the $f_o + 2f_a$ resonant frequencies of the frequency spectrum. The process of exciting successive side band frequencies and comb resonant frequencies, continues until oscillations occurring at all of the circuit resonant frequencies of the mode-locked frequency spectrum are phase locked together. A simplified illustration of the side band excitation is shown in FIG. 9, illustrations (a) through (d) which are illustrations in the frequency domain of the side band excitation provided by the amplitude modulator 120. Referring to FIG. 9, illustration (a), the initial center frequencies $f_o$ is the first resonant frequency to oscillate. The amplitude modulation of the $f_o$ RF pulse during circulation around the regenerative loop excites the side band frequencies $f_o \pm f_a$ (illustration (b)) at an initially low amplitude. Successive circulations of the center frequency and its side band frequencies cause excitation of the side bands $f_o \pm 2f_a$ to provide further resonant frequency excitation while the initial $f_o \pm f_a$ side bands increase in amplitude (illustration (c)). The process continues until the mode-locked frequency spectrum is completely excited. To a first order of approximation, the excited resonant frequencies will oscillate at a determined amplitude which approximately fills the profile of the loop gain bandwidth characteristic, as shown in FIG. 9, illustration (d), and also with a predetermined phase so that pulse to pulse phase coherence is achieved. In this manner the resonant frequencies are excited in the loop to the same extent of that provided in the embodiments of FIGS. 1, 6 as illustrated in FIG. 4, and the pulse width of the circulating RF signal pulse is similarly decreased to the minimum value limited by the loop bandwidth. An expansion of the harmonic frequency components of the RF signal pulses circulating around the regenerative loop may also be provided by phase modulation of the RF signals, instead of amplitude modulation. The frequency modulation of the RF signals provides a time varying phase change which, as well known in the art, provides a similar increase in signal pulse harmonic frequencies, and consequently pulse bandwidth. The modulation frequency is provided by the secondary loop in the same manner described hereinbefore with respect to FIG. 7. The RF modulation techniques are well known in the art, and include the use of a time varying component, such as that provided by time varying the capacitive reactance of a varactor diode in the RF signal path, by application of a time varying voltage to the diode. The time varying voltage magnitude is the magnitude of the synchronizing, or "video", pulse on the line 132 of FIG. 7. In addition, all of the signal shaping circuits, i.e. the expander of FIG. 6, of the amplitude or phase modulators of FIG. 7, may be provided with a modulating frequency from an external source rather than from a secondary loop within the MLSO. This external modulating frequency must be chosen to be equal to $f_a = 1/T$.

As disclosed, the MLSO of the present invention provides a regenerative pulse generator having a high degree of phase coherence and excellent short term stability. As such it is directly competitive with conventional pulsed RF oscillators presently used in the art to generate such phase coherent pulses, but at a significant reduction in cost since the SAW delay line, as the major component in the regenerative loop, may be a small, cheap planar component which is readily integrated with a microelectronic, or IC operational amplifier. The MLSO provides a high degree of phase coherence as a result of the inherent characteristics of the SAW delay line. The output pulses provided by the MLSO may be made extremely narrow, the limitation being the bandwidth of the MLSO and the ability of the expander to sharpen the pulse without destroying the oscillation mode. The active MLSO of FIGS. 6, 7 allows a greater degree of pulse width narrowing without the jeopardy of destroying the oscillation mode, in addition to ensuring self-starts. Furthermore, the active MLSO embodiments of FIGS. 6, 7 find more extensive use in wide ambient temperature environments which may cause increased attenuation of the regenerative pulse amplitude and destruction of the oscillation mode. The MLSO of the present invention provides an accurate set of RF signal pulses which may be used in a frequency synthesizer. Similarly, the MLSO may be used as a source of high accuracy timing signals, for use in controlling computer cycle time in a digital computer, or the master clock in a pulsed radar system. Similarly, although the invention has been shown and described with respect to illustrative embodiments thereof, it should be understood by those skilled in the art that the foregoing and various other changes, omissions and additions in the form and detail thereof may be made therein without departing from the spirit and the scope of this invention.

Having thus described typical embodiments of our invention, that which we claim as new and desire to secure by Letters Patent is:

1. A mode-locked surface acoustic wave oscillator for providing phase coherent, pulsed RF signals having a determined RF carrier frequency, pulse repetition frequency, and pulse width, comprising:

signal shaping means, having a gate input for receiving gate signals and an RF input for receiving input RF signal pulses of a determined RF carrier frequency, for providing, in response to each input RF signal pulse presented simultaneous with the presence of a gate signal at said gate input, and output RF signal pulse having an increased harmonic frequency content and equal carrier frequency;

surface acoustic wave (SAW) delay line means, connected for response to said signal shaping means, for providing a signal propagation time delay to each of said output RF signal pulses from said signal shaping means, said propagation time delay being substantially equal to the reciprocal of the RF signal pulse repetition frequency; and amplifier means, connected for response to the output of said SAW delay line means, for providing amplification of each RF signal pulse from said delay line means, said amplifier presenting the amplified RF signal pulses to said RF input of said signal shaping means, said amplifier providing in combination with said signal shaping means and said delay line means, a closed loop regenerative RF signal path having a determined frequency bandwidth and a minimum regenerative RF signal path gain equal to the sum of the regenerative RF signal path losses; and signal synchronizing means, responsive to the RF signal pulses in said regenerative RF signal path, for providing a gate signal in response to each of said RF signal pulses, said gate signals having a pulse repetition frequency equal to that of the RF signal pulses, said signal synchronizing means presenting each of said gate signals to said gate input of said signal shaping means.

2. The oscillator according to claim 1, wherein said surface acoustic wave (SAW) delay line means comprises:

a piezoelectric substrate having a major surface;

a pair of signal transducers relatively disposed at a determined SAW propagation distance from each other on said major surface, said pair of signal transducers including an input transducer and an output transducer, said input transducer being responsive to the output RF signal pulses from said signal means for providing, in response to each, a corresponding RF SAW signal pulse of equal carrier frequency in said substrate, said RF SAW signals having a determined propagation velocity, said output transducer being responsive to each of said SAW signals propagating along the determined propagation distance from said first transducer for providing, in response thereto, a corresponding electrical RF signal pulse of equal carrier frequency, said pair of signal transducers providing a determined frequency bandwidth having a center frequency equal to the carrier frequency of the RF signal pulses in said regenerative RF signal path, said signal propagation time delay being proportional to the ratio of said determined SAW propagation distance and the SAW propagation velocity.

3. The oscillator according to claim 2, wherein said signal shaping means comprises an expander means having a nonlinear attenuation characteristic for providing nonlinear signal shaping of each RF signal pulse appearing at the input thereof, said nonlinear attenuation characteristic being inversely proportional to the amplitude of the input RF signal pulse, said expander means presenting said nonlinear attenuation characteristic to each input RF signal pulse in the absence of a gate signal from said signal synchronizing means at said gate input.

4. The oscillator according to claim 1, wherein said signal shaping means comprises an amplitude modulation means for presenting a low attenuation characteristic to the RF signal pulses presented to the input thereof in response to the presence of a gate signal from said synchronizing means at said gate input, said amplitude modulator presenting a high attenuation characteristic to the RF signal pulses at all other times.

5. The oscillator according to claim 1, wherein said signal shaping means comprises a phase modulation means for varying the phase of the RF signal pulses presented to the input thereof in response to the presence of said gate signals from said synchronizing means at said gate input and in dependence on the magnitude of said gate signals.

6. The oscillator according to claim 1, wherein said signal synchronizing means comprises:
RF signal detector means, responsive to the RF signal pulses in the regenerative RF signal path, for providing a corresponding rectified RF signal pulse in response to each;
amplifier means, responsive to the rectified RF signal pulses from said detector means, for providing amplification of each of said rectified pulses; and
low-pass frequency filter means, connected for response to said amplifier means, for providing frequency filtering of the RF carrier frequency of each of the RF signal pulses to provide said gate signals at a determined magnitude.

7. A mode-locked surface acoustic wave oscillator for providing phase coherent, pulsed RF signals having a determined RF carrier frequency, pulse repetition frequency, and pulse width, comprising:
signal shaping means, having a gate input for receiving gate signals and an RF input for receiving input RF signal pulses of a determined RF carrier frequency, for providing, in response to each input RF signal pulse presented simultaneous with the presence of a gate signal at said gate input, an output RF signal pulse having an increased harmonic frequency content and equal carrier frequency;
surface acoustic wave (SAW) delay line means, connected for response to said signal shaping means, for providing a signal propagation time delay to each of said output RF signal pulses from said signal shaping means, said propagation time delay being substantially equal to the reciprocal of the RF signal pulse repetition frequency;
amplifier means, connected for response to the output of said SAW delay line means, for providing amplification of each RF signal pulse from said delay line means, said amplifier presenting the amplified RF signal pulses to said RF input of said signal shaping means, said amplifier providing in combination with said signal shaping means and said delay line means, a closed loop regenerative RF signal path having a determined frequency bandwidth and a minimum regenerative RF signal path gain equal to the sum of the regenerative RF signal path losses; and
signal source means, for providing a synchronizing signal, including a series of gate signals at a pulse repetition frequency equal to that of the RF signal pulses in the regenerative RF signal path, said signal source means providing said synchronizing signal to said gate input of said signal shaping means.

8. The oscillator according to claim 7, wherein said surface acoustic wave (SAW) delay line means comprises:
a piezoelectric substrate having a major surface;
a pair of signal transducers relatively disposed at a determined SAW propagation distance from each other on said major surface, said pair of signal transducers including an input transducer and an output transducer, said input transducer being responsive to the output RF signal pulses from said signal shaping means for providing, in response to each, a corresponding RF SAW signal pulse of equal carrier frequency in said substrate, said RF SAW signals having a determined propagation velocity, said output transducer being responsive to each of said SAW signals propagating along the determined propagation distance from said first transducer for providing, in response thereto, a corresponding electrical RF signal pulse of equal carrier frequency, said pair of signal transducers providing a determined frequency bandwidth having a center frequency equal to the carrier frequency of the RF signal pulses in said regenerative RF signal path, said signal propagation time delay being proportional to the ratio of said determined SAW propagation distance and the SAW propagation velocity.

9. The oscillator according to claim 8, wherein said signal shaping means comprises an expander means having a nonlinear attenuation characteristic for providing nonlinear signal shaping of each RF signal pulse appearing at the input thereof, said nonlinear attenuation characteristic being inversely proportional to the amplitude of the input RF signal pulse, said expander means presenting said nonlinear attenuation characteristic to each input RF signal pulse in the absence of a gate signal from said signal synchronizing means at said gate input.

10. The oscillator according to claim 8, wherein said signal shaping means comprises an amplitude modulation means for presenting a low attenuation characteristic to the RF signal pulses presented to the input thereof in response to the presence of a gate signal from said signal source means at said gate input, said amplitude modulator presenting a high attenuation characteristic to the RF signal pulses at all other times.

11. The oscillator according to claim 8, wherein said signal shaping means comprises a phase modulation means for varying the phase of the RF signal pulses presented to the input thereof in response to the presence of said gate signals from said signal source means at said gate input and in dependence on the magnitude of said gate signals.

* * * * *

UNITED STATES PATENT AND TRADEMARK OFFICE
CERTIFICATE OF CORRECTION

PATENT NO. : 4,085,388
DATED : April 18, 1978
INVENTOR(S) : M. Gilden, T.M. Reeder, A.J. DeMaria It is certified that error appears in the above-identified patent and that said Letters Patent are hereby corrected as shown below:

Column 5, line 2, "$t_p$" should be -- $t_P$ --.

Column 6, line 2 "saw" should be -- SAW --.

Column 9, line 37, "1N14" should be -- 1N914 --.

Column 12, line 41, "and $f_a$" should be -- and $f_o$ --.

Column 12, line 43, "$f_o +$" should be -- $f_o \pm$ --.

Column 14, line 55, after "signal" insert -- shaping --.

Signed and Sealed this

Nineteenth Day of September 1978

[SEAL]

Attest:

RUTH C. MASON
*Attesting Officer*

DONALD W. BANNER
*Commissioner of Patents and Trademarks*